United States Patent
Dunn et al.

(10) Patent No.: US 7,105,913 B2
(45) Date of Patent: Sep. 12, 2006

(54) TWO-LAYER PATTERNED RESISTOR

(75) Inventors: Gregory J. Dunn, Arlington Heights, IL (US); Scott N. Carney, Palatine, IL (US); Jovica Savic, Downers Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 70 days.

(21) Appl. No.: 10/743,589

(22) Filed: Dec. 22, 2003

(65) Prior Publication Data

US 2005/0133872 A1    Jun. 23, 2005

(51) Int. Cl.
*H01L 27/082* (2006.01)

(52) U.S. Cl. .................................................... 257/582

(58) Field of Classification Search ............... 438/382, 438/384, 385, 381, 688; 427/101; 174/260; 257/580, 582, 577, 581
See application file for complete search history.

(56) References Cited

U.S. PATENT DOCUMENTS 5,976,943 A     11/1999  Manley et al.
6,534,743 B1 *  3/2003   Swenson et al. ....... 219/121.69

FOREIGN PATENT DOCUMENTS

EP    1 261 241 A1   5/2002
WO    WO 00/56128  *  9/2000

OTHER PUBLICATIONS

Dunn, Gregory J. "Three-Ply Foil for Fabrication of Embedded Resistors" Jan. 2002 WWW.IP.COM.

* cited by examiner

*Primary Examiner*—Howard Weiss
*Assistant Examiner*—(Vikki) Hoa B. Trinh

(57) ABSTRACT

A technique for fabricating a patterned resistor on a substrate produces a patterned resistor (101, 801, 1001, 1324, 1374) including two conductive end terminations (110, 810, 1010) on the substrate, a pattern of first resistive material (120, 815, 1015) having a first width (125) and a first sheet resistance, and a pattern of second resistive material (205, 820, 1020) having a second width (210) and a second sheet resistance that at least partially overlies the pattern of first resistive material. One of the first and second sheet resistances is a low sheet resistance and the other of the first and second resistances is a high sheet resistance. A ratio of the high sheet resistance to the low sheet resistance is at least ten to one. The pattern having the higher sheet resistance is substantially wider than the pattern having the low sheet resistance. The patterned resistor can be precision trimmed 1225.

9 Claims, 5 Drawing Sheets

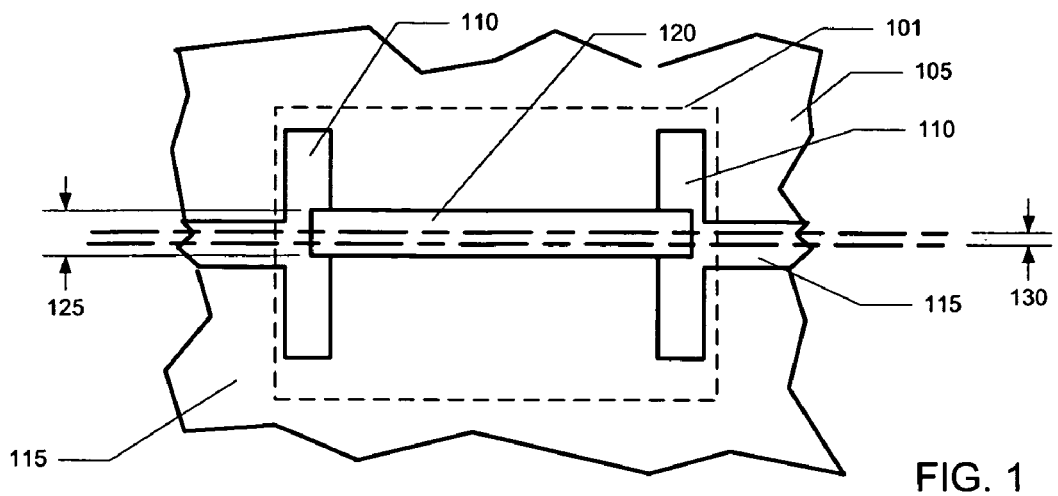
FIG. 1
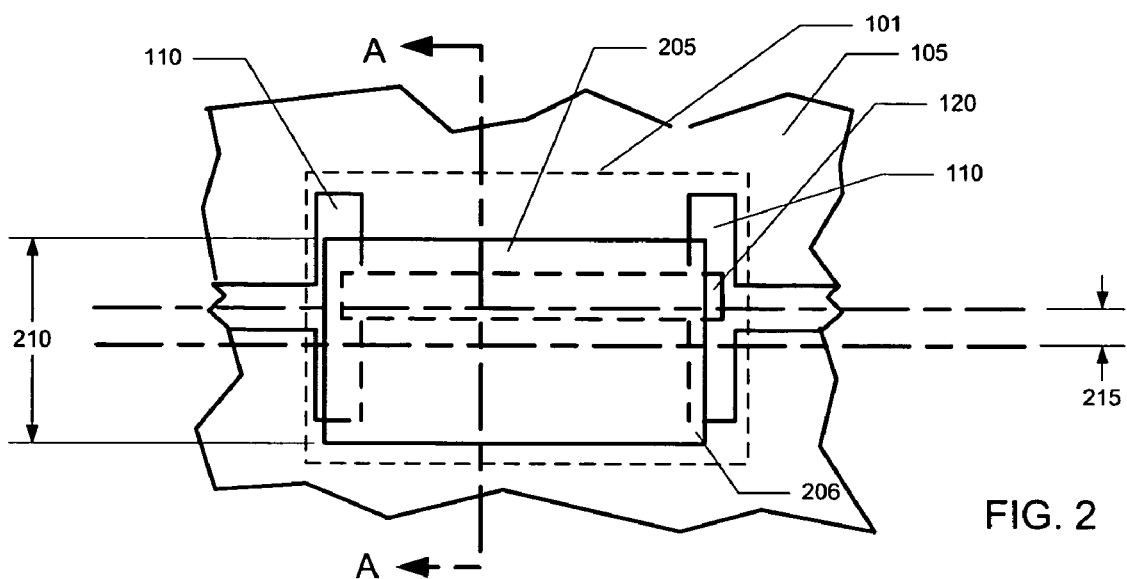
FIG. 2
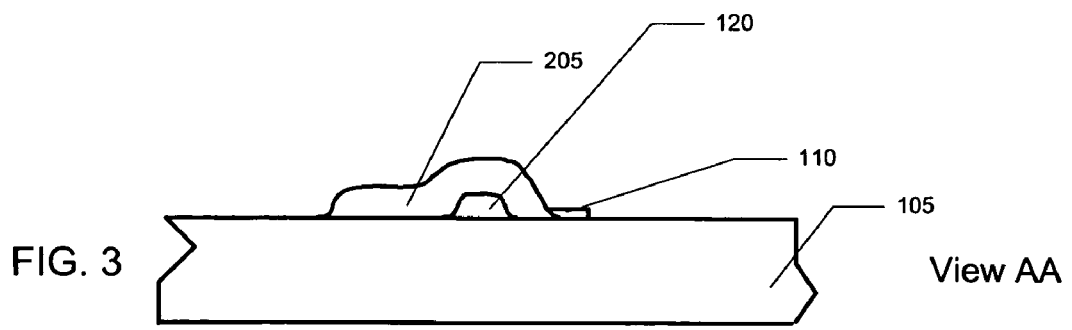
FIG. 3  View AA

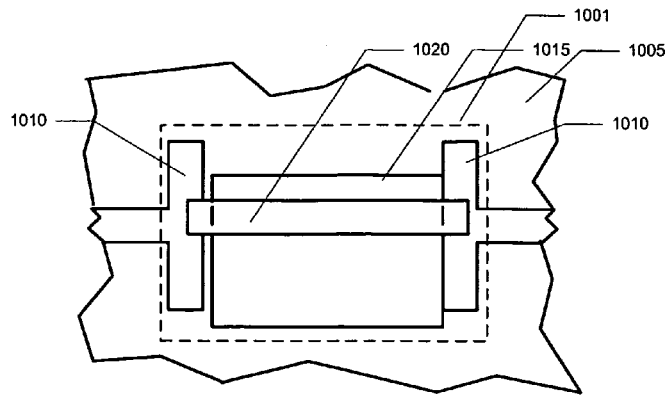

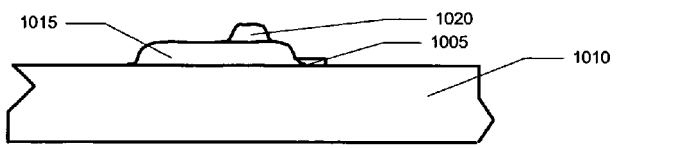

FIG. 12 patterning two conductive end terminations on the substrate — 1210 patterning a first layer of resistive material — 1215 patterning a second layer of resistive material — 1225 fine tuning the patterned resistor using a fine trim kerf that is extended solely into the high resistance material. — 1230 coarse tuning the patterned resistor using a coarse trim kerf that is extended into the low resistance material. — 1235 determine positions of edges of the patterned first and second layers of resistive materials — 1245 determine a large offset side of the patterned resistor — 1240 start the fine trim kerf at the large offset side of the patterned resistor. — 1250 measure increments of the resistance of the patterned resistor — 1255 determine larger offset side from locations of substantial changes of the increments

TWO-LAYER PATTERNED RESISTOR

FIELD OF THE INVENTION

This invention is related to resistors that are patterned on a substrate.

BACKGROUND

Screen printed resistors are used extensively in many types of electronic products. For example, a circuit board in a cellular handset can have more than 200 resistors. In many instances, these are embedded within a layer of the circuit board, so as to leave room for larger parts on the exposed surfaces. Embedded resistors are presently fabricated with width and length as small as 250 microns, using laser trimming to obtain a desired value within an acceptable tolerance (e.g., 1%). It is desirable to reduce the dimensions of the resistors, consistent with overall product size reduction. Even the current dimensions, however, are challenging. Reducing width substantially below 250 microns is difficult, because typical minimum laser kerfs are about 50 microns, making it difficult to fine tune the resistor value within acceptable tolerances. Reducing length substantially below 250 microns is difficult, even when the width is greater than 250 microns, because a second laser kerf, either parallel to or perpendicular to the first cut, is typically used to fine tune the resistor value after a first kerf has been used for coarse tuning, and very short resistors will not accommodate a second cut.

BRIEF DESCRIPTION OF THE DRAWINGS

The present invention is illustrated by way of example and not limitation in the accompanying figures, in which like references indicate similar elements, and in which:

FIGS. 1, 2, 4, 6, 7, 8, and 10 are plan view drawings of patterned resistors that are being fabricated on portions of a substrate, in accordance with embodiments of the present invention;

FIGS. 3 and 11 are cross section view drawings of patterned resistors that are being fabricated on portions of a substrate, in accordance with embodiments of the present invention;

FIG. 12 is a flow chart that shows a method to fabricate a patterned resistor on a substrate, in accordance with embodiments of the present invention, including some of those described herein.

Figure 4:
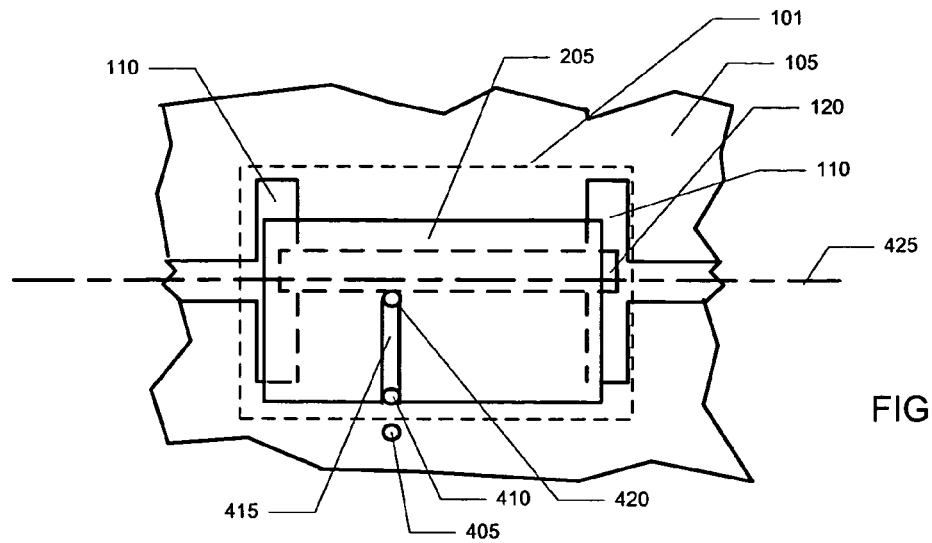

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular patterned resistor in accordance with the present invention, it should be observed that the present invention resides primarily in combinations of method steps and apparatus components related to patterned resistors. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

Referring to FIG. 1, a plan view drawing of a patterned resistor 101 that is being fabricated on a substrate is shown, in accordance with an embodiment of the present invention. The substrate, of which a portion 105 is shown in FIG. 1, may be any material on which patterned resistors can be formed, and may typically be an inner layer of a multi-layer printed circuit structure, although such need not be the case. For example, the substrate may be a layer of glass epoxy material, of which one well known example is the type designated FR4, or a layer of ceramic material such as alumina, or a layer of polyimide. The patterned resistor 101 at the stage of fabrication shown in FIG. 1 comprises two conductive end terminations 110 that are on the substrate and a pattern of first resistive material 120 that has a first width 125 and a first sheet resistance. Each of the two conductive end terminations 110 has a conductive connection 115 to some other electrical component or connector. A layer of the first resistive material is applied on the surface of the substrate between the two conductive end terminations 110 in order to form the pattern of first resistive material 120 of the resistor 101, and also to form (typically) many other patterns of first resistive material for other resistors. In this first embodiment of the present invention, the pattern of first resistive material 120 also extends onto the two conductive end terminations 110. The layer of first resistive material may be applied by any method for applying a substantially uniform layer of resistive material that can be patterned. Examples of such application techniques are screen printing, stenciling, direct writing, and foil lamination. In some of the application techniques, the application and patterning may be two steps. The foil lamination technique is an example for which a second step could be used to form the patterns. The substantially uniform layer is characterized by a layer thickness, which is an average thickness of the layer of first resistive material. In an example of resistive material that is applied by screen printing carbon-phenolic resistor material, the layer thickness may be approximately 12 microns. The layer of first resistive material has a resistance characterized by a sheet resistance for the layer thickness being used, measured in units of ohms per square, as is well known in the art. In this embodiment of the present invention, the width 125 of the pattern of first resistive material 120 is approximately 125 microns, and the ohms per square is relatively low, such as 40 ohms per square. The width of 125 microns is substantially smaller than the smallest widths commonly used for fabricating conventional patterned resistors. In the example illustrated in FIG. 1, the resistor 101 is about 6.25 squares, so the nominal resistance is about 250 ohms. Process variations cause the pattern of first resistive material 120 to have an offset 130 between the average centerline of the long axis of the pattern of first resistive material 120 and the respective centerline of the two conductive end terminations 110 which does not cause a variance from a desired resistance value for the pattern of first resistive material 120 of the partially fabricated resistor 101. (The centerline of the two conductive end terminations 110 may alternatively be described as the design, or ideal location of the first resistive material 120, irrespective of where the conductive connections join the conductive end terminations.) However, it will be appreciated that the resistance values of patterned resistors such as partially fabricated resistor 101 typically vary from a desired value due to process and material variations. It is common to fabricate a patterned resistor with dimensions (width and length, or squares, which is the dimensionless value obtained by dividing length by width) such that under all normal process variations the resistance value will be less than the desired value, and then use a laser trim process to trim the resistor value up to the desired value. However, at the width of the pattern of the first resistive material 120 of the present invention, it is very difficult to control the laser cutting process sufficiently to achieve moderately high precision resistances, such as those within 1% of a desired value, because the diameter of a very narrow laser beam of the type needed to cut the resistor material is on the order of 50 microns. If, in the example being described (the width of the patterned layer of first resistance material being 125 microns), the desired resistance is 250±1%, and the actual resistance is 230 (8% low), the trimming of the resistor 101 has to raise the resistance to a value between 247.5 ohms and 252.5 ohms. Furthermore, the expected amount of variation increases for narrower resistors, because the process variations (as percentages) tend to be larger for narrower patterned resistors. Achieving the required trimming precision with economical laser equipment is very difficult.

Referring to FIG. 2, a plan view drawing of the patterned resistor 101 that is being fabricated on the portion 105 of the substrate is shown, in accordance with an embodiment of the present invention. In another step of the process to fabricate the resistor 101, after the layer of first resistive material is patterned on the substrate for all resistors that are designed to achieve their nominal value by using the first resistive material, a layer of second resistive material is patterned over the pattern of first resistive material 120. The resulting pattern of second resistive material 205 has a second width 210 and a second sheet resistance. The pattern of second resistive material 205 at least partially overlies the pattern of first resistive material 120 and extends between the two conductive end terminations 110, and may also extend onto the two conductive end terminations 110. The width of the pattern of second resistive material is substantially wider than, i.e., at least approximately 50% wider than, the width of the first resistive material, or at least 50 microns wider than the width of the first resistive material. As for the layer of first resistive material, the layer of second resistive material may be applied by any method for applying a substantially uniform layer of resistive material that can be patterned, and is characterized by a layer thickness. The material may be carbon-phenolic and the layer thickness may be approximately 12 microns. The ohms per square of the layer of second resistive material is relatively high—at least 10 times higher than the ohms per square of the first resistive material. In this example, it is 3,000 ohms per square. The width 210 of the pattern of second resistive material 205 may be approximately the same as the width of the two conductive end terminations 110. In the example illustrated in FIG. 2, the pattern of second resistive material is about 2 squares, so the nominal resistance is about 6,000 ohms. Process variations cause the pattern of second resistive material 205 to have an offset 215 between the average centerline of the long axis of the pattern of second resistive material 120 and the respective centerline of the two conductive end terminations 110. Such process variations may cause a portion 206 at the ends of pattern of the second resistive material 205 to not be on the two conductive end terminations 110, which does not substantially affect the benefits provided by the present invention.

Referring to FIG. 3, a cross section view drawing of the patterned resistor 101 that is being fabricated on the portion 105 of the substrate is shown, in accordance with an embodiment of the present invention. The cross section view shows the patterns of the first and second resistive materials 120, 205, one of the two conductive end terminations 110, and the portion 105 of the substrate to clarify the relationships of the items.

Referring to FIG. 4, a plan view drawing of the patterned resistor 101 that is being fabricated on the portion 105 of the substrate is shown, in accordance with an embodiment of the present invention. After the patterns of first and second resistive materials are formed for at least the resistor 101, and typically also after the patterns for all resistors being formed by the first and second resistive materials on this layer of the substrate are completed, a coarse tuning step is performed. A laser beam is positioned at an initial position 405 sufficiently far from the centerline 425 of the two conductive end terminations 110 to assure that it will not be within the pattern of first resistive material 120, and it may also be positioned to assure that it will not be within the pattern of second resistive material 205. A measurement is taken of the total initial resistance of the resistor 101. The beam is then moved toward the centerline 425 at a relatively constant rate. As the beam moves, measurements are taken at relatively constant intervals of the total resistance of the resistor 101. A difference between each of the measurements made while the beam is moving and the previous measurement is calculated to determine increments of the resistance of the resistor 101 while the beam is moved. When the laser beam reaches the second resistive material, the material is cut, forming a kerf 415.

Figure 5:
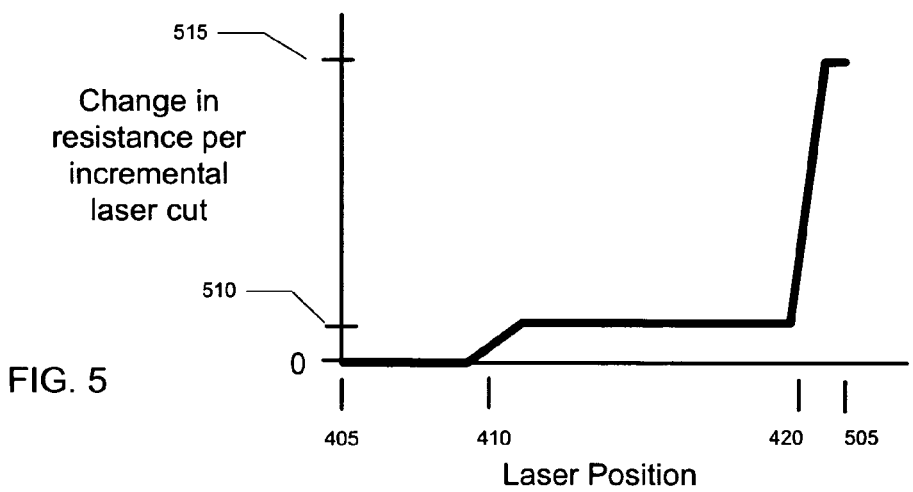
FIGS. 5 and 9 are simplified graphs of increments of resistance of patterned resistors that are being fabricated on portions of a substrate, in accordance with embodiments of the present invention.

Referring to FIG. 5, a simplified graph of the change in resistance per incremental laser cut of resistor 101 is shown, in accordance with an embodiment of the present invention. While the beam is between the initial position 405 and the edge of the pattern of the second resistive material 205, near position 410, there are no increments to the total resistance of resistor 101 (these increments have a value of zero). When the beam is at position 410, it has begun to cut a kerf in the pattern of second resistive material 205 and any increments measured near position 410 may be increased. However, once the beam is fully within the pattern of second resistive material 205, the measurements of the incremental resistance change due to the incremental increase of the kerf have a relatively constant value 510 that is small and does not change substantially until the beam comes to a position 420 at the edge of the pattern of the first resistive material 120. Although the kerf 415 causes a significant change in the amount of resistance presented to current flowing between the two conductive end terminations 110 through the pattern of second resistive material 205, the total resistance between the two conductive end terminations 110 is altered by only a small amount for each incremental increase of the length of kerf 415 because the pattern of second resistive material 205 is effectively connected in parallel with the pattern of first resistive material 120. In the example shown, if the actual resistance of the pattern of first resistive material 120 is 210 ohms (16% below a desired value of 250 ohms) and the actual resistance of the pattern of second resistive material 205 is 6300 ohms before it is trimmed (which is 5% above a nominal value of 6,000 ohms), then initial actual resistance is about 203.2 ohms. The kerf 415 may have changed the value of the pattern of second resistive material to 6350 ohms, so the total resistance at that point is approximately 203.3 ohms. It will be appreciated that the value 510 of the increments is very small, on the order of 0.01 ohms if 10 measurements are made during the cutting of the pattern of second resistive material 205. It will further be appreciated that the representation in FIG. 5 is idealized for simplicity. The change in resistance is not actually linear with respect to laser position. Rather, the flow of current through a cut resistor is a complex function of the length and width of the resistor and the length and width of the kerf. FIG. 5 and this discussion assume a linear relationship for simplicity. The actual nonlinear behavior does not substantially alter the arguments made herein that once the laser position is within the bulk of the second resistive material the incremental change in resistance is relatively uniform and small.

At laser position 420 increments in total resistance drastically increase in value, reaching a value 515 that represents the increment of the resistance due to the cutting of the first resistive material near the edge. (As indicated by a discussion above, the increment will actually increase because of the nonlinear relationship between the length of the kerf 415 towards the centerline and the resistance).

Figure 6:
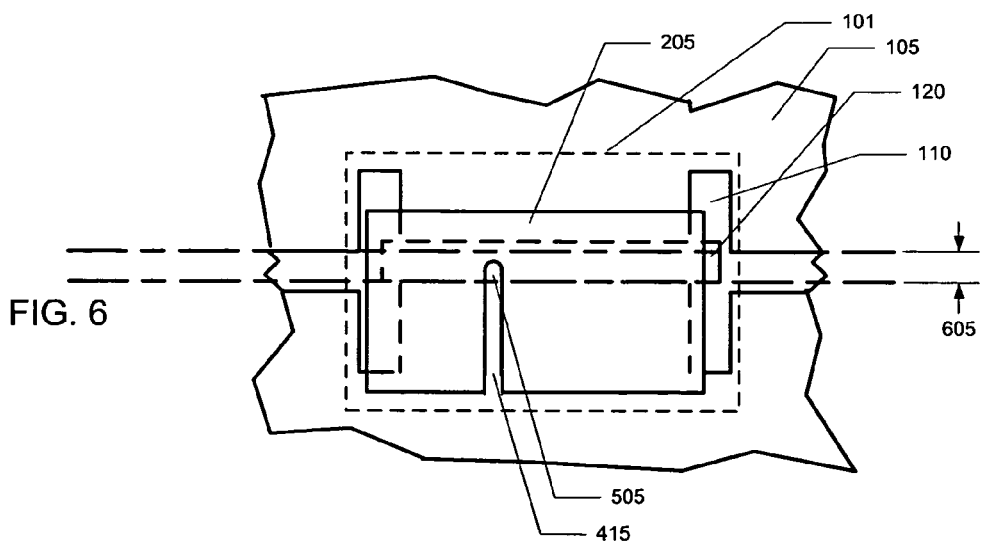

Referring to FIG. 6, a plan view drawing of the patterned resistor 101 that is being fabricated on the portion 105 of the substrate is shown, in accordance with an embodiment of the present invention. A coarse precision is predetermined for the coarse tuning of resistor 101 that is based on the sheet resistances of the layers of first and second resistive materials, the size (in squares) of the patterns of first and second resistive materials 120, 205, and the precision of control of the position of the laser beam. When the measured resistance reaches a value that is within the predetermined coarse precision of the desired resistance of resistor 101, coarse tuning is complete and the beam is turned off at end position 505. In some instances, more than one kerf must be cut into the pattern of first resistive material 120 to achieve a resistance within the predetermined coarse precision without cutting into the pattern of first resistive material 205 using more than a predetermined maximum length 605. In the present example, the predetermined coarse precision value is 5%, so the kerf 415 is ended when the resistance becomes more than 237.5 ohms.

Figure 7:
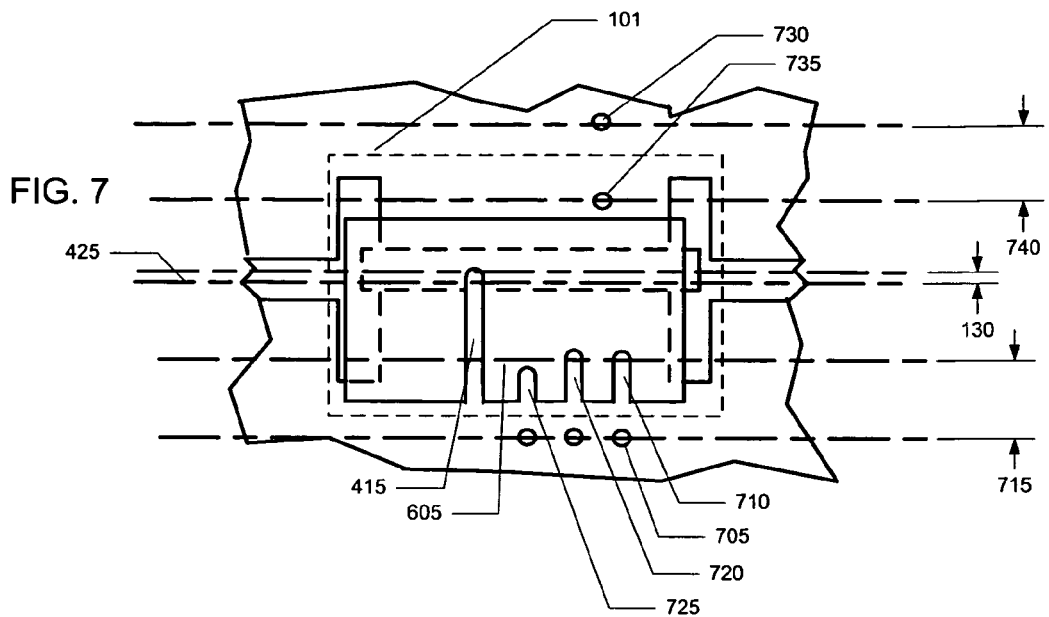

Referring to FIG. 7, a plan view drawing of the patterned resistor 101 that is being fabricated on the portion 105 of the substrate is shown, in accordance with an embodiment of the present invention. After the coarse tuning step is completed, a fine tuning step is performed. In accordance with one embodiment of the present invention, the laser beam is positioned on the same side of the resistor 101 as for the coarse tuning cuts, and cutting starts at position 705, which is the same distance from the centerline 425 of the two conductive end terminations 110 as was the initial position 405 for the coarse tuning. The laser beam is then turned on and moved towards the centerline 425, cutting kerf 710. The laser beam is stopped when kerf 710 has reached a maximum length 715 that has been predetermined such that the kerf 710 will not cut into the pattern of first resistive material 120 under all process variations that cause changes to the offset 130 of the pattern of the first resistive material with reference to the centerline 425. Because this restricts the amount of first resistive material that is cut by the kerf 710, a plurality of kerfs 710, 720, 725 are cut in order to bring the final resistance of the resistor 101 to within 1% of the desired value (e.g., 2.5 ohms for the desired 250 ohms). In this example, it is assumed that the length of resistor 101, the thickness of the kerfs, and the precision of control of the laser are such that the kerfs 415, 705, 710, 720 provide adequate change to the total actual resistance of the resistor 101. Typically by today's standards, such cuts should be separated by approximately 175 microns. It will be appreciated that, in this embodiment, there will be instances in which kerfs that are made from one of the two sides of the resistor 101 may not be able to be cut into the pattern of second resistive material 205 at all. This result is due the constraint used to avoid cutting into the pattern of the first resistive material 120 under all process variations, as illustrated by the initial position 730 and final position 735 of an attempted laser cut on the side opposite the kerfs 710, 720, 725 that is limited to a length 740 equivalent to length 715.

Figure 8:
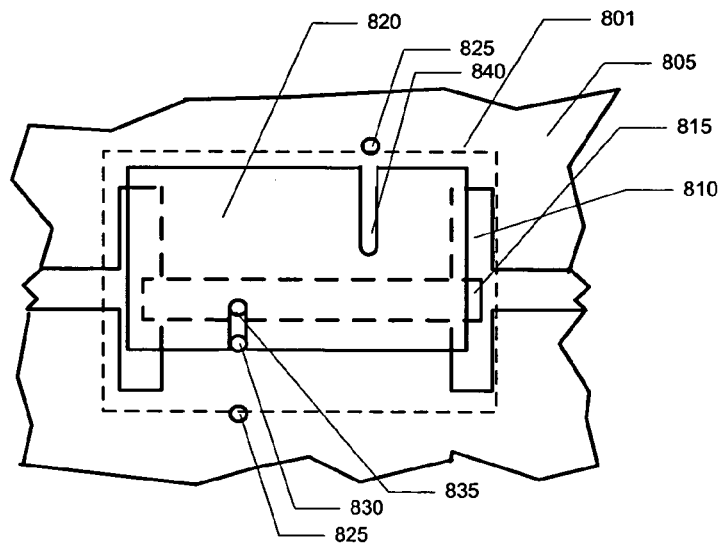
Figure 9:
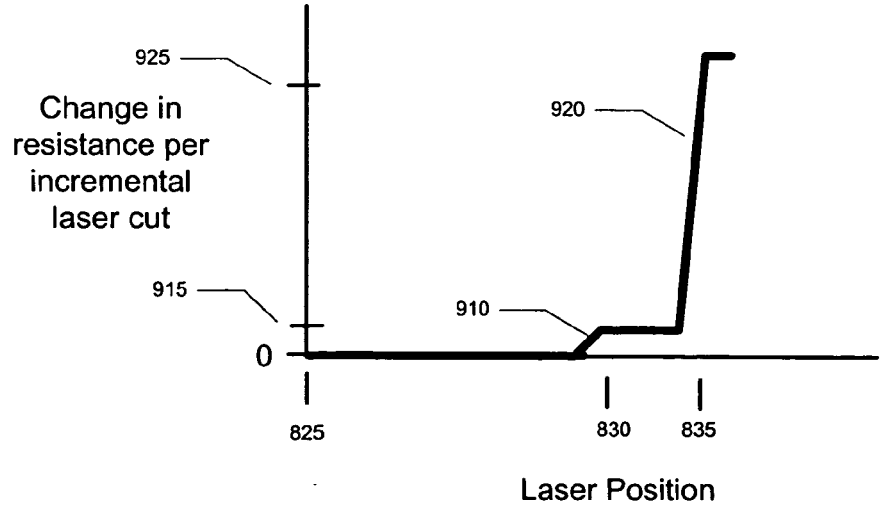

Referring to FIG. 8, a plan view drawing of the patterned resistor 801 that is being fabricated on a portion 805 of a substrate is shown, in accordance with another embodiment of the present invention. The resistor 801 is of the same dimensions as resistor 101 described above, but the offsets of the patterns of the first and second resistive materials 815, 820 are oriented differently with reference to the two conductive end terminations 810 and the initial position 825 of the laser beam in the coarse tuning step than the offsets described with reference to resistor 101. The coarse tuning step is begun at the same position that was described above for resistor 101. Refer also to FIG. 9, which is a simplified graph of the increments of resistance of resistor 801, in accordance with an embodiment of the present invention. The increments of the measured resistance of resistor 801 are zero until position 830 is reached, at which point there is a substantial change 910 of the increments of resistance to a low, but non-zero value 915. When position 835 is reached, a substantial change 920 of the increments again occurs, after which the value 925 of increments becomes very large. Similar to the earlier example, the laser beam is stopped when a resistance of resistor 801 is within a predetermined fine precision of a desired resistance of resistor 801. In this embodiment, the substantial changes 910, 925 in values of the increments are used to determine the edges of the patterns of first and second resistive materials 815, 820. From this determination, a determination may be made as to which side of the resistor 801 offers a larger distance from the edge (also called herein the farther edge) of the pattern of second resistive material 820 to the edge of the pattern of first resistive material 815, and the fine tuning kerfs are cut from the side having the larger distance, as illustrated by kerf 840. Additionally, coarse kerf cuts made after the first kerf cut may be initiated from the side having the shorter distance from the edge of the pattern of second resistive material 820 to the edge of the pattern of first resistive material 815, and the initial position of the laser beam may be moved close to the edge of the resistive material that is related to the tuning being done (i.e., close to the edge of the first resistive material 815 for additional coarse tuning cuts and close to the edge of the second resistive material 820 for all fine tuning cuts).

It will be appreciated that the benefits derived from determining the positions of the edges of the patterns of the first and second resistive materials could be derived by other means and methods of determination, such as using optics after each layer is patterned, or using a combination of optics and resistance values.

It will be further appreciated that although the kerf cuts described with reference to FIGS. 4–8 are described for simplicity to be continuous channels that are cut essentially perpendicular to the centerline of the respective resistors 101, 801, the term "kerf" or "kerf cut" as used in this document contemplates all variations of resistive material removal that remove incremental amounts of resistive material small enough to permit at least some incremental removals of the second resistive material that do not also remove any first resistive material. This would include, for example, L shaped laser cuts or a series of laser holes punched into the resistive materials, or, for example, incremental resistive material removal by an abrasive means or other ablative means.

Referring to FIG. 10, a plan view drawing of a patterned resistor 1001 that is being fabricated on a portion 1005 of a substrate is shown, in accordance with another embodiment of the present invention. In this embodiment, a pattern of first resistive material 1015 has a high sheet resistance and extends between, but is essentially not on, the two conductive end terminations 1010. A pattern of second resistive material 1020 has a low sheet resistance (at most one-tenth that of the high sheet resistance), and extends between and is on the two conductive end terminations 1010. A cross section of this arrangement is shown in FIG. 11 for clarity.

Referring now to FIG. 12, a flow chart of a method to fabricate a patterned resistor on a substrate is shown, in accordance with embodiments of the present invention, including some of those described herein. At step 1205, two conductive end terminations are patterned on the substrate. A first layer of resistive material having a first sheet resistance is patterned at step 1210 to have a first width and to extend on the surface of the substrate between the two conductive end terminations. At step 1215, a second layer of resistive material having a second sheet resistance is patterned to have a second width, to extend between the two conductive end terminations, and to at least partially overlay the first layer of resistive material. This becomes a pattern of second resistive material. One of the first and second layers of resistive material are patterned to extend onto the two conductive end terminations. One of the first and second sheet resistances is a low sheet resistance and the other of the first and second resistances is a high sheet resistance. A ratio of the high sheet resistance to the low sheet resistance is at least ten to one.

It will be appreciated that in some instances, no coarse tuning kerf need be cut because the initial measured resistance of the resistor is within the predetermined coarse precision. Thus, an additional step 1225 is fine tuning the resistor using a first trim kerf that is extended solely into the high resistive material. In those instances for which a coarse trim cut is needed, there is an additional step 1230 of coarse tuning the resistor using a second trim cut (which occurs before the first trim cut) that is extended into the low resistance material.

In some embodiments, additional steps are added. At step 1235, positions of edges of the high resistance material and the low resistance material are determined. The positions of the edges are used at step 1240 to determine a large offset side of the patterned resistor that has a larger separation between the edges of the patterns of high resistive and low resistive materials. At step 1245, the first trim kerf (the fine tuning trim kerf) is started at the large offset side of the patterned resistor.

In some embodiments, yet more steps are added. The determining of the larger offset side of the patterned resistor comprises measuring increments of the resistance of the patterned resistor during the second (coarse) trim kerf cut at step 1250 and determining the larger offset side from locations of substantial changes of the increments at step 1255.

Figure 13:
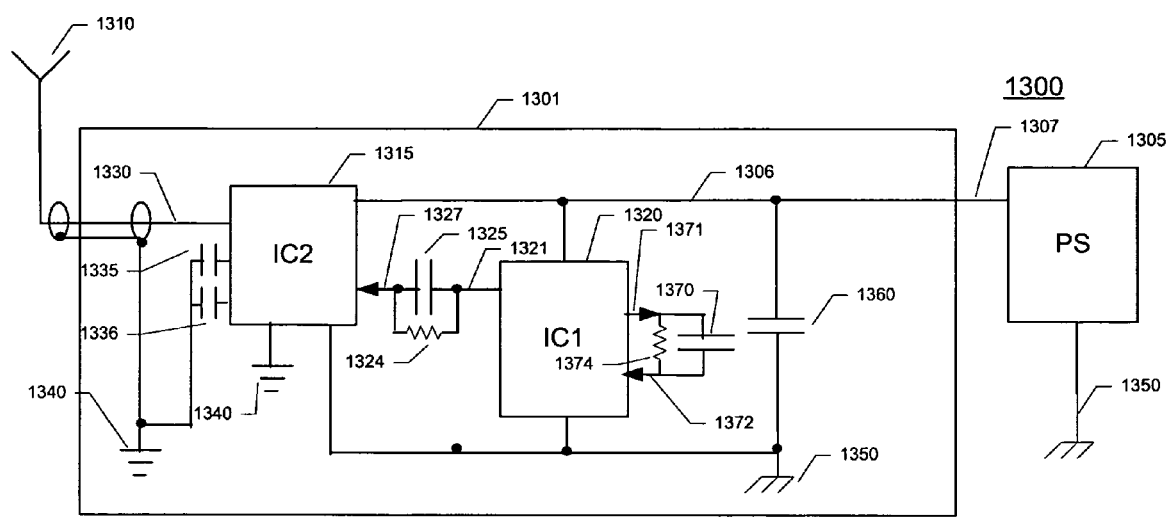
FIG. 13 is an electrical block diagram that shows an electronic device that incorporates patterned resistors in accordance with the embodiments of the present invention.

Referring now to FIG. 13, an electrical block diagram shows an electronic device 1300 that incorporates patterned resistors in accordance with the embodiments of the present invention described above. The electronic device can be any electronic device that uses a printed circuit board 1301 having a power source 1305. The power source 1305 generates a DC supply voltage 1306 that is coupled to integrated circuit 1 (IC1) 1320, IC2 1315, and at to least one power decoupling capacitor 1360. In the case of the electronic device 1300, the power decoupling capacitors 1360 are coupled to a chassis ground 1350, as is the power source 1305. IC1 1320 generates a signal 1371 that is filtered by a precision resistor 1374 and a coupling capacitor 1370, and returned to IC1 1320 as filtered signal 1372. IC1 1320 generates another signal 1321 that is filtered by precision resistor 1324 and coupling capacitor 1325. The filtered signal 1327 is coupled to IC2 1315. IC2 1315 has a radio frequency (RF) output amplifier that is grounded to an RF ground 1340. An output of the RF amplifier is coupled to an antenna 1310 by a coaxial cable 1330 that is also coupled to the RF ground 1340. Two de-coupling capacitors 1335, 1336 provide bypass filtering to the RF ground for two undesired RF signals (e.g., spurious frequencies). In this instance, the two de-coupling capacitors 1335, 1336 are connected to the RF ground 1340. The precision resistors 1324, 1374 are two patterned resistors of many that are fabricated on a layer of the printed circuit board 1301, the surface of which serves as the substrate described above during the fabrication of the resistors 1324, 1374, which uses the techniques of the present invention to achieve a 1% tolerance of their desired values. The precision resistors 1324, 1374 are coupled through other electronic components (in this case, electronic components within IC1 1320 and IC2 1315) to a coupling 1307 to the DC power supply 1305. The electronic device 1300 is representative of any electronic device that can be coupled to one or more power sources, either AC or DC and that uses patterned resistors of the present invention to perform the functions of such electronic device. A few examples of such electronic devices are partially and fully completed printed circuit board subassemblies, completed electronic kits, cellular telephones, personal digital managers, toys, appliances, test equipment, controllers, computers, weapons, displays, televisions, etc. All such devices may benefit from the present invention.

It will be appreciated that the present invention offers at least two advantages over conventional techniques. The present invention allows precision trimming for very narrow resistors; that is, for resistors including a resistive material that is narrower than 250 microns, because the effect of any kerfs cut into such narrow resistors having only a single resistive material is so large. Additionally, the present invention offers a means for precision trimming of very short resistors, i.e., those less than 250 microns in length, because cutting a second, precision kerf (such as the leg of an L shaped kerf that is conventionally used for wider resistors) into the resistive material of a prior art, short single resistive material resistor is not practical.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The term "another", as used herein, is defined as at least a second or more. The terms "including" and/or "having", as used herein, are defined as comprising. The term "coupled", as used herein with reference to electro-optical technology, is defined as connected, although not necessarily directly, and not necessarily mechanically.

What is claimed is:

1. A method for fabricating a patterned resistor on a substrate, comprising:
   patterning two conductive end terminations on and directly contacting the surface of the substrate;
   patterning a first layer of resistive material having a first sheet resistance to have a first width and to extend on and directly contacting the surface of the substrate between the two conductive end terminations;
   patterning a second layer of resistive material having a second sheet resistance to have a second width, to extend between the two conductive end terminations, and to at least partially overlay the first layer of resistive material; and
   patterning one of the first and second layers of resistive material to extend onto the two conductive end terminations, wherein one of the first and second sheet resistances is a low sheet resistance and the other of the first and second resistances is a high sheet resistance, and wherein a ratio of the high sheet resistance to the low sheet resistance is at least ten to one, and wherein the one of the patterns of first and second resistive materials that has the high sheet resistance is substantially wider than the other of the patterns of first and second resistive material.

2. The patterned resistor according to claim 1, wherein the one of the patterns of first and second resistive materials that has the high sheet resistance is at least 50% wider than the other of the patterns of first and second resistive material.

3. The patterned resistor according to claim 1, wherein the one of the patterns of first and second resistive materials that has the high sheet resistance is at least 50 microns wider than the other of the patterns of first and second resistive material.

4. The method according to claim 1, further comprising:
   applying the first layer of resistive material by one of screen printing, stenciling, direct writing, and foil lamination; and
   applying the second layer of resistive material by one of screen printing, stenciling, direct writing, and foil lamination.

5. The method according to claim 1, wherein the patterning of the one of the first and second layers of resistive materials to extend onto the two conductive end terminations, comprises patterning the one of the first and second layers of resistive materials that has a low sheet resistance to extend onto the two conductive end terminations.

6. The method according to claim 1, further comprising fine tuning the patterned resistor using a fine trim kerf that is extended solely into the one of the first and second layers of resistive materials that has a high sheet resistance.

7. The method according to claim 6, further comprising coarse tuning the patterned resistor using a coarse trim kerf that is extended into the one of the first and second layers of resistive materials that has a low sheet resistance.

8. A method for fabricating a patterned resistor on a substrate, comprising:
   patterning two conductive end terminations on the surface of the substrate;
   patterning a first layer of resistive material having a first sheet resistance to have a first width and to extend on the surface of the substrate between the two conductive end terminations;
   patterning a second layer of resistive material having a second sheet resistance to have a second width, to extend between the two conductive end terminations, and to at least partially overlay the first layer of resistive material;
   patterning one of the first and second layers of resistive material to extend onto the two conductive end terminations, wherein one of the first and second sheet resistances is a low sheet resistance and the other of the first and second resistances is a high sheet resistance, and wherein a ratio of the high sheet resistance to the low sheet resistance is at least ten to one, and wherein the one of the patterns of first and second resistive materials that has the high sheet resistance is substantially wider than the other of the patterns of first and second resistive material;
   fine tuning the patterned resistor using a fine trim kerf that is extended solely into the one of the first and second layers of resistive materials that has a high sheet resistance;
   coarse tuning the patterned resistor using a coarse trim kerf that is extended into the one of the first and second layers of resistive materials that has a low sheet resistance;
   determining positions of edges of the patterned first and second layers of resistive materials;
   using the positions of the edges to determine a large offset side of the patterned resistor that has a larger separation between the edges of the patterned first and second layers of resistive materials; and
   starting the fine trim kerf at the large offset side of the patterned resistor.

9. The method according to claim 8, wherein the coarse trim kerf is cut before the fine trim kerf is cut, and wherein the determining of the larger offset side of the patterned resistor comprises:
   measuring increments of the resistance change of the patterned resistor during the coarse trim kerf cut; and
   determining the larger offset side from locations of substantial changes of the increments.

* * * * *